US009240255B2

(12) United States Patent
McMorran et al.

(10) Patent No.: US 9,240,255 B2
(45) Date of Patent: Jan. 19, 2016

(54) DEVICE AND METHOD FOR CREATING GAUSSIAN ABERRATION-CORRECTED ELECTRON BEAMS

(71) Applicants: Benjamin McMorran, Eugene, OR (US); Martin Linck, Heidelberg (DE)

(72) Inventors: Benjamin McMorran, Eugene, OR (US); Martin Linck, Heidelberg (DE)

(73) Assignees: University of Oregon, Eugene, OR (US); The United States of America, as represented by the Secretary of Commerce, Washington, DC (US); The Regents of the University of California, Berkeley, CA (US)

( * ) Notice: Subject to any disclaimer, the term of this patent is extended or adjusted under 35 U.S.C. 154(b) by 133 days.

(21) Appl. No.: 14/199,947

(22) Filed: Mar. 6, 2014

(65) Prior Publication Data

US 2014/0252228 A1    Sep. 11, 2014

Related U.S. Application Data

(60) Provisional application No. 61/773,746, filed on Mar. 6, 2013.

(51) Int. Cl.
*G21K 1/06* (2006.01)
*H01J 37/26* (2006.01)

(52) U.S. Cl.
CPC ............... *G21K 1/06* (2013.01); *H01J 37/263* (2013.01); *H01J 2237/2614* (2013.01)

(58) Field of Classification Search
USPC ........................................................ 250/311
See application file for complete search history.

(56) References Cited

U.S. PATENT DOCUMENTS

| | | | | |
|---|---|---|---|---|
| 6,545,808 B1* | 4/2003 | Ehbets | ................. | G02B 5/1857 359/15 |
| 2004/0069957 A1* | 4/2004 | Menon | ................. | G03F 7/70291 250/492.2 |
| 2012/0153144 A1 | 6/2012 | McMorran | | |
| 2013/0193322 A1* | 8/2013 | Blackburn | ............ | H01J 37/147 250/311 |

OTHER PUBLICATIONS

Kearney et al., "Imaging and focusing of neutrons by a zone plate," *Nature*, 287:313-314 (Sep. 1980).
Kirz, "Phase zone plates for x rays and the extreme uv," *Journal of the Optical Society of America*, 64:301-309 (Mar. 1974).
Kulovits et al., "Grain size determination in nano-scale polycrystalline aggregates by procession illumination-hollow cone dark field imaging in the transmission electron microscope," *Materials Characterization*, 63:17-26 (2012).
McMorran et al., "Electron vortex beams with high quanta of orbital angular momentum," *Science*, 331:192-195 (2011).
Moeck et al., "Precession electron diffraction & automated crystallite orientation/phase mapping in a transmission electron microscope," *11th IEEE International Conference on Nanotechnology*, pp. 754-759 (Aug. 2011).

* cited by examiner

*Primary Examiner* — Kiet T Nguyen
(74) *Attorney, Agent, or Firm* — Klarquist Sparkman, LLP

(57) ABSTRACT

Electron beam phase gratings have phase profiles that produce a diffracted beam having a Gaussian or other selected intensity profile. Phase profiles can also be selected to correct or compensate electron lens aberrations. Typically, a low diffraction order produces a suitable phase profile, and other orders are discarded.

8 Claims, 9 Drawing Sheets

DEVICE AND METHOD FOR CREATING GAUSSIAN ABERRATION-CORRECTED ELECTRON BEAMS

CROSS REFERENCE TO RELATED APPLICATION

This application claims the benefit of U.S. Provisional Application 61/773,746, filed Mar. 6, 2013, which is incorporated herein by reference.

ACKNOWLEDGMENT OF GOVERNMENT SUPPORT

This invention was made with government support from the U.S. Department of Commerce and through Contract No. DE-AC02-05CH11231 awarded by the U.S. Department of Energy. The government has certain rights in this invention.

FIELD

The disclosure pertains to electron beam shaping using phase gratings.

BACKGROUND

Electron beams used in instrumentation such as scanning electron microscopes, transmission electron microscopes, microprobes, etc. exhibit numerous deficiencies that limit the performance of these instruments. For example, electron beams are generally defined by apertures with hard edges, usually circular. Diffraction from these hard-edge apertures results in a beam profile known as an Airy disc, which can result in an undesirable point spread function (PSF) for the instrument. For applications where a tightly focused electron beam is used to form an image, it may be desirable to use a probe beam that has a different intensity profile, such as that described by a Gaussian distribution. In optical devices this is usually achieved using a Gaussian aperture. Such an aperture will not work for electron optical systems, however, due to incoherent scattering within the aperture material. In addition, electron beam optical systems typically exhibit aberrations that limit elecron beam focussing and imaging.

SUMMARY

Disclosed herein are methods and apparatus for defining Gaussian and other beam profiles using diffraction from a phase grating. Grating diffraction efficiency can be spatially varied, such that a beam is diffracted most efficiently at the center of the grating, less efficiently near the edges, and not at all far away from the center of the grating. In some examples, phase gratings are formed by periodically varying the thickness of a transparent material. By periodically patterning a transparent substrate, a periodic phase can be imprinted onto a transmitted beam. The beam then diffracts into multiple beams at discrete angles (diffraction orders). A diffraction efficiency, defined as a ratio between the intensity in a first diffraction order to that of the incident beam, is a function of the modulated optical path length (OPL) difference. In other examples, grating pitch (grating phase) is varied.

In some examples, the depth of periodic grooves is modulated by an extended Gaussian profile. That is, the grooves defining the grating are deepest at the center of the diffractive element, and diffract the beam more efficiently into the first diffracted order. The groove depth smoothly decreases as a Gaussian function the further away from the grating center. Likewise, the first-order diffraction efficiency is largest at the center of the grating, and decrease towards the edges of the patterned area due to the decreased depth modulation. This results in a diffracted beam that has a Gaussian intensity profile.

In some examples, apparatus comprise a diffractive element situated to receive a particle beam and produce at least one diffracted particle beam in a selected diffraction order. The diffractive element defines a phase variation associated with a particle beam intensity profile, and an aperture is situated to transmit the selected diffraction order. In typical examples, the phase variation is a Gaussian phase variation and the diffractive element includes periodic grooves having a groove depth selected to produce a Gaussian phase variation. In some embodiments, the diffractive optical element defines a phase variation corresponding to at least one Laguerre-Gaussian or Hermite-Gaussian beam intensity profile. In typical examples, the diffractive element is defined in a silicon nitride substrate and includes periodic grooves of depth between 1 nm and 200 nm, wherein a groove period is between 10 nm and 200 nm. In other examples, the phase variation of the diffractive optical element corresponds to a phase error associated with a particle beam lens. In additional embodiments, the particle beam lens is situated to receive the particle beam from the diffractive optical element. In some examples, the particle beam is an electron beam.

According to representative examples, scanning electron microscopes comprise an electron beam source situated to direct an electron beam along an axis to an electron lens that receives the electron beam. A phase grating having a phase variation corresponding to a phase error introduced by the electron lens is situated so that the electron lens and the phase grating produce a phase compensated electron beam based on a diffraction order of the phase grating, wherein the electron lens directs a focused, compensated beam to a specimen. An electron beam scanning system is situated to scan the focused, compensated electron beam with respect to the specimen and an electron detection system is situated to detect portions of the focused, compensated electron beam received from the specimen. An image processor is coupled to the electron detection system and the electron beam scanning system so as to produce an image based on the detected portions of the focused, compensated electron beam received from the specimen and the scanning of the focused, compensated electron beam at the specimen. In some embodiments, the phase variation is based on an aberration of the electron lens such as spherical aberration. In other examples, the phase grating is situated to produce a plurality of diffraction orders, and an aperture is situated to transmit a selected diffraction order associated with the phase compensated electron beam.

Methods comprise selecting a phase profile to be applied to a particle beam and defining a phase grating having the phase profile such that, when exposed to a particle beam, a diffraction order having a phase corresponding to the phase profile is produced. In some specific examples, a first diffraction order has a phase corresponding to the phase profile, and a second diffraction order has a phase corresponding to an inverse of the phase profile. In still other examples, the phase profile is associated with compensation of spherical aberration, and the first diffraction order is substantially spherical aberration compensated, and the second diffraction order has a phase profile associated with twice a phase error associated with spherical aberration. In other examples, the phase profile corresponds to a Hermite-Gaussian or a Laguerre-Gaussian profile, such as Gaussian profile. In still other representative examples, selecting the phase profile comprises estimating a phase error associated with an aberration of a particle beam optical element.

The foregoing and other objects, features, and advantages of the disclosed technology will become more apparent from the following detailed description, which proceeds with reference to the accompanying figures.

DETAILED DESCRIPTION

Figure 1:
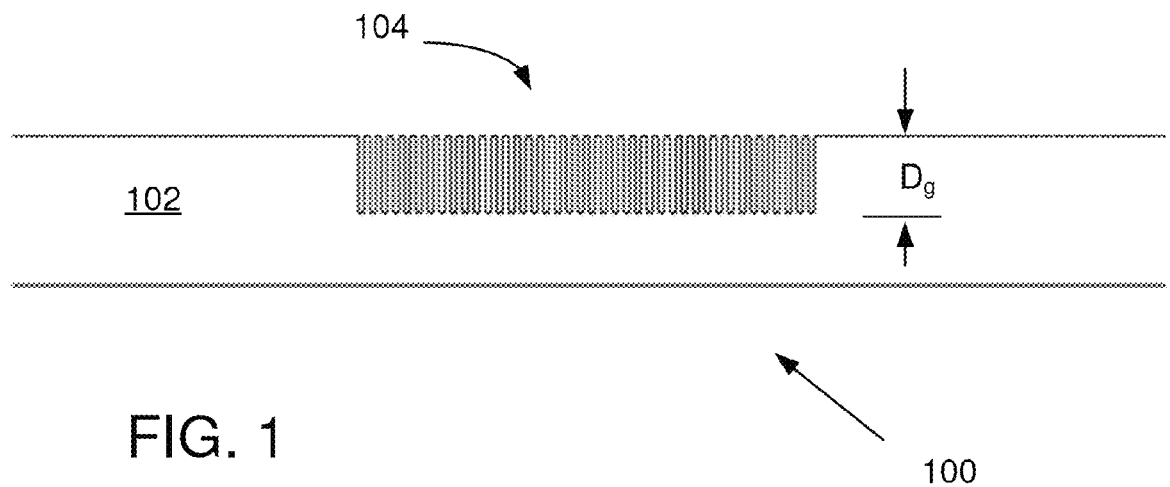
FIG. 1 is a cross sectional view of a representative phase grating for diffraction of an electron beam. The grating can be formed of a substantially electron transparent material with periodic grooves having a depth corresponding to a selected phase to produce a predetermined, spatially varying diffraction efficiency.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

As used herein, an image refers to a viewable image of a specimen or a portion thereof such as presented on a display device as well as a stored representation of a viewable image such as digital data stored in a computer readable memory device such as RAM, ROM, a hard disk, or other storage device. In some examples, images are formed by detection of particle interactions with a specimen as a beam is scanned over the specimen so that beam scanning can provide localization of detected particles.

Beam profile or intensity profile refers to local beam power as a function of a radial coordinate or other coordinates in a plane perpendicular to a direction of propagation. For convenience, beams produced by diffraction are referred to herein as diffraction orders.

Disclosed herein are methods, systems, and apparatus that imprint one or more phase, amplitude, or phase and amplitude patterns onto charged particle or uncharged particle beams. Typical examples are described with reference to electron beams along with representative applications of such electron beams, but other charged particles can be used. In some examples, Laguerre-Gaussian or Hermite-Gaussian beam profiles are produced with a diffractive element, such as a phase or amplitude grating. In one example, a Gaussian profile is imprinted onto a beam with a phase grating having a spatially varying diffraction efficiency such that a beam is diffracted most efficiently at a center of a beam, less efficiently near the edges, and not at all far away from the center. In typical examples, diffractive elements are formed using silicon nitride, platinum, carbon or diamond films, or silicon that are formed with a focused ion beam or a lithographic techniques such as electron beam lithography.

As used herein, gratings provide periodic variations in optical path length (OPL), and/or beam amplitude by varying beam attenuation or reflection or other propagation characteristic. In many examples, diffractive elements or gratings have a single periodic variation with a fixed period and arranged in a single direction. However, diffractive optical elements can be based on a plurality of periods or spatial frequencies such as combinations and/or superpositions of modulations at a plurality of spatial frequencies such as a chirped diffractive optical element. Modulations can be associated with differing spatial frequencies in different directions in a diffractive optical element. For example, a phase grating can include different modulation frequencies along orthogonal axes. In typical examples, phase gratings are defined by grooves in a substrate; such grooves can be filled with a material different than that of the substrate, or remain unfilled. While diffractive elements as disclosed herein can produce amplitude modulations in addition to phase modulations, if desired, typically phase modulation is preferred so diffractive elements can be highly transmissive, and incoherent and inelastic scattering from the diffractive elements is reduced. Typically grating depths are selected based on a desired diffraction order intensity, and variations in grating pitch space can be selected based on a desired diffraction order phase.

EXAMPLE 1

Gaussian and Other Beam Shapes

An optical path length (OPL) provided by a diffractive element (or grating) can be varied by periodically varying the thickness of a transparent material. While transparent, the material nonetheless introduces a phase shift in a transmitted beam. By periodically patterning the surface of a transparent plate, one can imprint a periodic phase onto the transmitted beam. The beam then diffracts into multiple beams at discrete angles corresponding to $\lambda/D$, wherein $\lambda$ is beam wavelength and D is grating pitch. A first order diffraction efficiency, defined as a ratio between intensity in the first diffraction order to that of the incident beam, is a function of the modulated OPL difference. Gratings with a very shallow surface modulation (grooves) may not diffract beams as efficiently as gratings with deeper grooves, and diffraction efficiency may saturate or decline as grating depth increases. Thus, a phase profile established on a phase grating may not produce an exactly matching intensity in a diffracted beam, but a suitable phase profile can be established based on diffraction efficiency.

FIG. 1 illustrates an electron beam phase grating 100 that includes a patterned region 104 defined in a silicon nitride substrate 102. The patterned region 104 includes a periodic arrangement of linear grooves of depth $D_g$. In typical examples, groove period (grating pitch) is between about 10 nm and 200 nm, 15 nm and 100 nm, 20 nm and 90 nm, or 25 nm and 80 nm. Smaller pitches produce greater separations of diffraction orders, so that even smaller pitches than those listed can be convenient, although such pitches may be difficult to fabricate. Groove depth is selected to produce phase differences of a few µrad to many radians, as desired. Typical groove depths are between 1 nm and 500 nm, 10 nm and 300 nm, or 20 nm and 200 nm. As shown in FIG. 1, groove depth is constant, but groove depth is typically variable as discussed below.

Figure 2A:
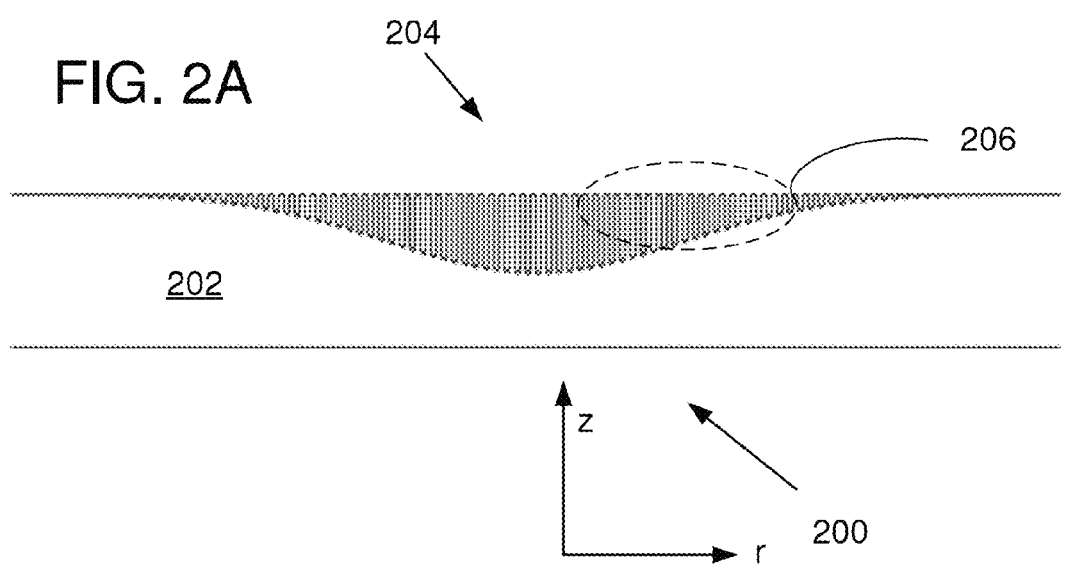
FIG. 2A is a cross section of a representative phase grating that imprints a Gaussian modulation onto an incident electron beam. Grating groove depth is selected to produce a diffraction efficiency that varies as a Gaussian, such that diffracted orders from the grating have Gaussian intensity profiles.
Figure 2B:
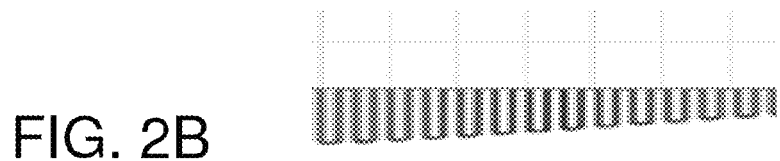
FIG. 2B is an expanded view of a portion of the grating of FIG. 2A.

Referring to FIG. 2A, an electron beam phase grating 200 includes a series of periodic grooves 204 formed in a substrate 202. Groove depth $D_g$ (along a z-axis) is a function of a transverse (radial) coordinate (r), i.e., $D_g=D_g(r)$. In one example, the depth of periodic grooves is modulated by an extended Gaussian profile so that $$D_g(r)=D_{max}e^{-\alpha r^2},$$

wherein $D_{max}$ is a maximum groove depth at r=0, and $\alpha$ is a constant. As a result, portions of an incident beam directed to the grating 200 at locations closer to r=0 are more efficiently into a first diffraction order. In this example, groove depth smoothly decreases as a Gaussian function and first-order diffraction efficiency can be largest at the center of the grating, and decrease towards the edges of the patterned area due to the decreased depth modulation. This results in a diffracted beam that has a Gaussian intensity profile. FIG. 2B is an enlarged view of a grating section 206.

Figure 3:
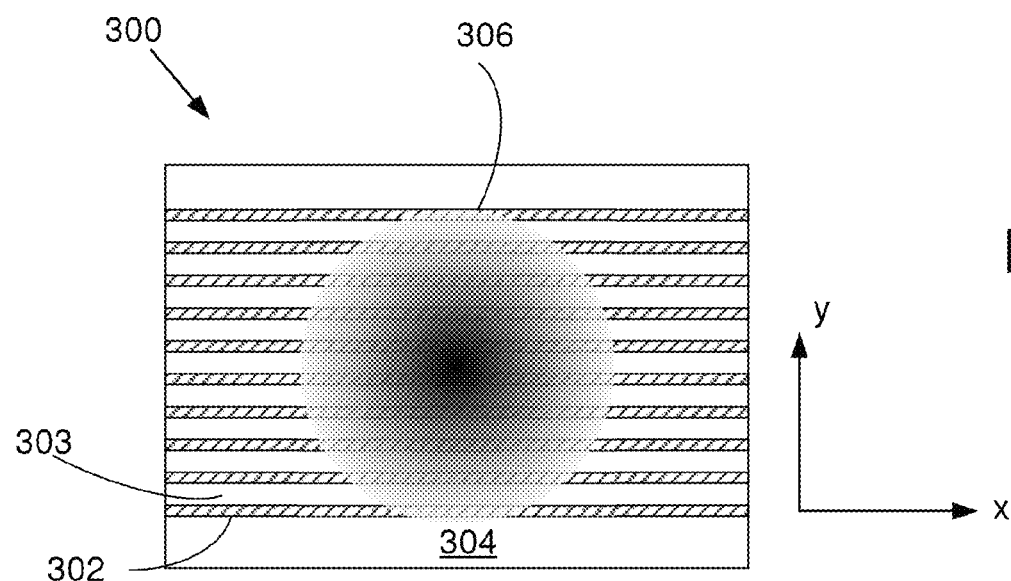
FIG. 3 is a plan view of a phase grating defined by periodic circular grooves.

FIG. 3 illustrates a Gaussian phase grating 300 that is defined in a substrate 304. The phase grating 300 includes periodic grooves such as representative groove 302 and corresponding ridges such as representative ridge 303. Groove depth can be a function of x and y-coordinates as needed. As shown in FIG. 3, a region 306 is configured to that groove depth is a function (such as a Gaussian function) of a radial distance r from a center of the region 306.

Phase gratings for electron beams can be formed by ion beam milling into a substrate so as to define grooves. Photolithographic processes can also be used in which a substrate is covered with resist, and the resist is patterned by exposure to, for example, an electron beam. The exposed resist is then developed, portions of the exposure (or unexposed) resist are removed, and the substrate is etched to form grooves. The resist can then be removed. Square-wave like gratings (equal width grooves and ridges, and each groove having a single depth) can be used, but ridges and grooves need not have the same dimension, and gratings of variable depth can be used such as sinusoidally varying depths. Gratings of variable depth can be formed by varying the exposure during ion beam milling. Gratings can also be formed by deposition of one or more materials on a substrate.

Figure 4:
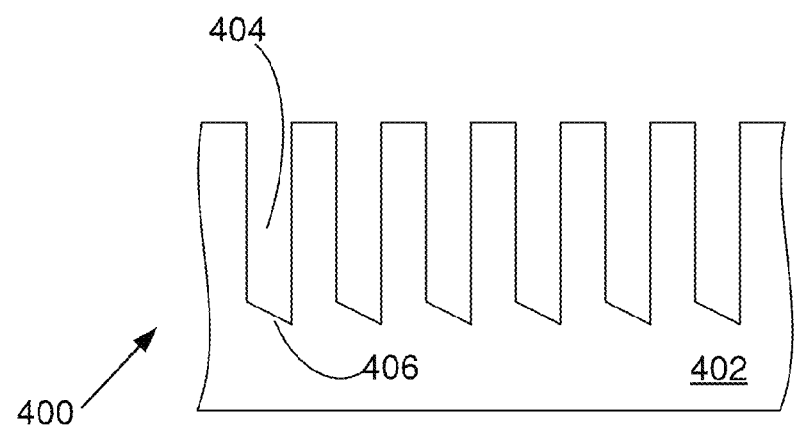
FIG. 4 is a sectional view of a portion of a blazed phase grating.

Phase gratings (and other gratings as well) can be provided with shaped grooves so as to serve as blazed gratings to increase diffraction efficiency into a selected diffraction order. Referring to FIG. 4, a portion of a blazed diffraction grating 400 includes grooves such as representative groove 404 defined in a substrate 402. A groove surface 406 is angled so as to increase diffraction efficiency into a +1 or other diffraction order. The grating 400 is somewhat more complex to fabricate due to the tilt of surfaces such at the groove surface 406.

Figure 5:
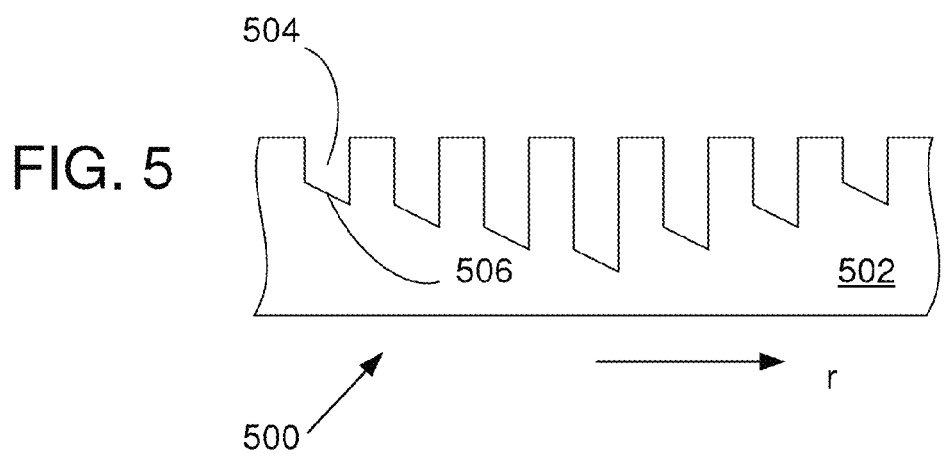
FIG. 5 is a cross sectional view of a representative blazed phase grating that imprints a Gaussian modulation onto an incident electron beam and preferentially diffracts into a selected diffraction order.

The example of FIG. 4 include grooves that are substantially the same. In contrast, referring to FIG. 5, a portion of a blazed diffraction grating 500 includes grooves such as representative groove 504 defined in a substrate 502. The grooves have a spatially varying depth Dg(r) that is a function of a radial coordinate r. A groove surface 506 is angled so as to increase diffraction efficiency into a +1 or other diffraction order.

Figure 6:
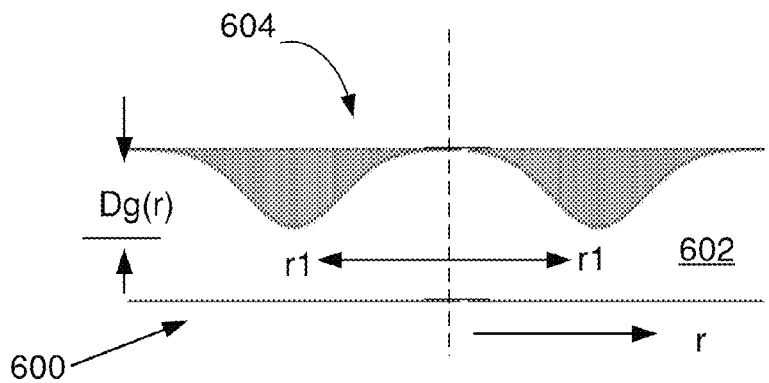
FIG. 6 illustrates a phase grating that applies a phase modulation corresponding to a higher-order electron beam mode.

While Gaussian electron beams and gratings for producing Gaussian beams are preferred in many applications, other beam power distributions can be produced. Referring to FIG. 6, a diffraction grating 600 is defined by a groove pattern 604 defined on a substrate 602. Groove depth is small (or zero) at r=0, increasing to r=r1, and then decreasing as r grows larger. With groove depth a function of r, the grating 600 can be used to produce a beam corresponding to a to 10 Laguerre-Gaussian mode. If the groove depth varied only along a single linear axis (such as an x-axis), a 10 or 01 Hermite-Gaussian mode could be produced. Other higher order modes can similarly be produced using appropriate grating phase distributions.

Figure 7:
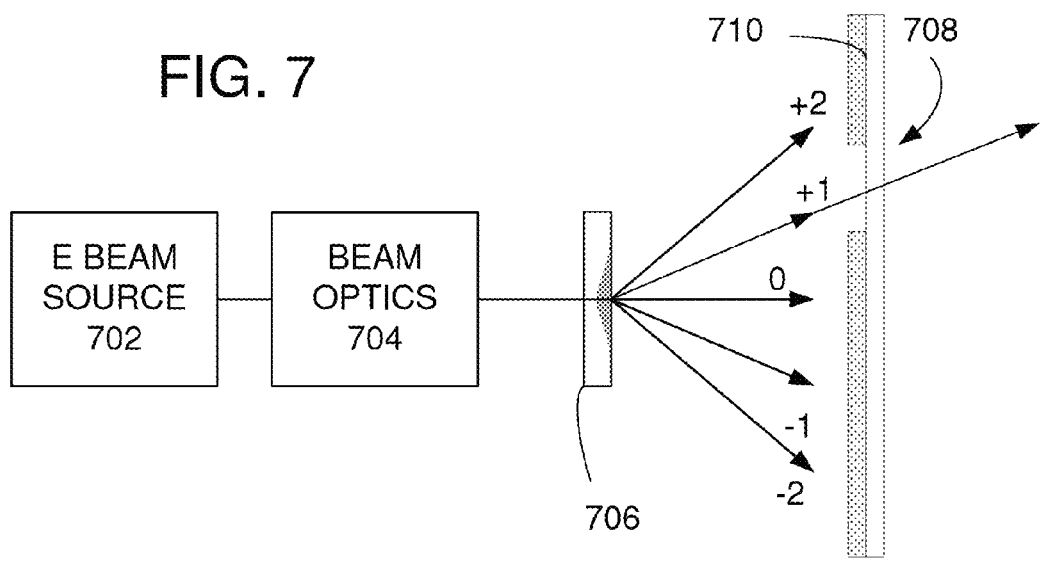
FIG. 7 illustrates a system that produces a Gaussian electron beam as a +1 diffraction order from a phase grating.

While suitable intensity profiles can be produced in a diffraction order using gratings such as shown above, typically multiple diffraction orders are produced along with an undiffracted beams. A single diffraction order can be selected to obtain a beam having the intended power distribution. Referring to FIG. 7, an electron beam source 702 produces an electron beam that is directed to an electron optical system 704 that shapes the electron beam. The electron beam is then directed to a phase grating 706 that produces a plurality of diffraction orders. As shown in FIG. 7, a +1 order is transmitted by an aperture 708 formed on an aperture plate 710. The selected diffraction order is then directed to a target or otherwise used as desired. An intensity profile of the selected beam is based on the phase variations defined on the grating 706.

Figure 8:
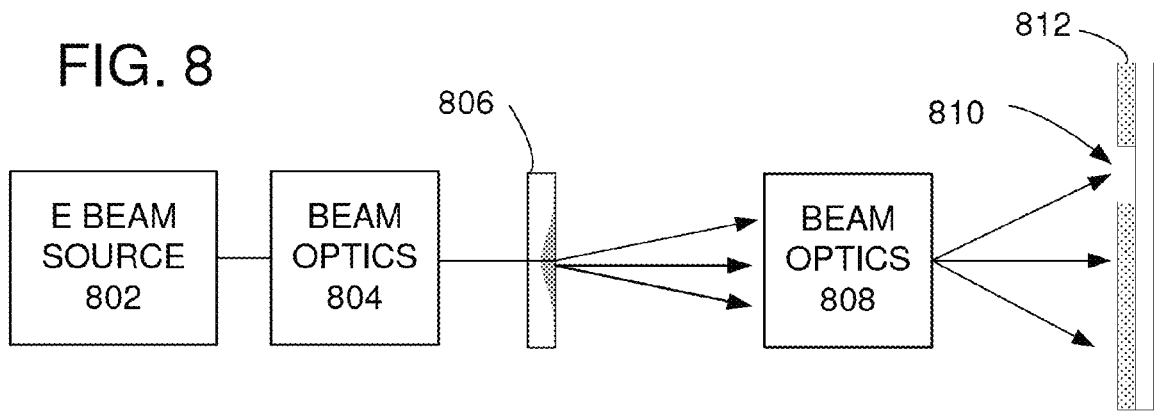
FIG. 8 illustrates a system that produces multiple diffraction orders that are coupled to an additional electron beam optical system so as to select a Gaussian electron beam associated with a +1 diffraction order.

In some cases, beam diffraction angles are small, and separation of diffraction orders can be accomplished with additional beam optics. As shown in FIG. 8, an electron beam source 802 directs a beam to beam optics 804 and to a phase grating 806. The diffracted beams are directed to an additional optical system 808 that increases divergence of the diffracted orders, and a selected order is transmitted by an aperture 810 in an aperture plate 812.

EXAMPLE 2

Aberration Correction

Phase gratings can be used to imprint a phase on a beam to correct or compensate spherical aberration (or other aberrations) in an objective or other lens. Spherical aberration can produce a phase shift $$\Phi = \exp\left\{-i\frac{2\pi}{\lambda}\frac{C_3}{4}\theta^4\right\},$$

wherein $\theta$ is a half-angle at which a beam (or portion thereof) is incident to the objective lens, $C_3$ is a constant corresponding to lens spherical aberration, and $\lambda$ is electron beam wavelength. Reducing this phase shift tends to reduce beam deficiencies associated with spherical aberration, and a diffractive element that imprints an opposite phase can eliminate spherical aberration. If beam aberration is corrected or compensated, tighter beam focus with a higher beam power can be obtained. For a phase shift $\chi_g$ of a diffraction grating to cancel the spherical aberration $\chi_{OL}$ of an objective lens, a grating parameter $C_g$ can be determined as $$\chi_{OL} = \frac{2\pi}{\lambda}\frac{C_3}{4}\theta_{max}^4 = C_g R_{max}^4 = \chi_g,$$

wherein $R_{max}$ is a radius of a maximum lens aperture that is used. The grating parameter is then $$C_g = \frac{2\pi}{\lambda}\frac{C_3}{4}\frac{\theta_{max}^4}{R_{max}^4},$$

and grating phase is to vary as $C_g R^4$. Grating depth can be varied to adjust diffraction efficiency.

In one example, a diffraction grating was designed to correct a spherical aberration of $C_3$=1.25 mm for an illumination half angle of 17.5 mrad at 300 kV (electron wave length l=1.97 pm). For a common condenser lens setting, this illumination angle corresponds to a condenser aperture radius of $R_{max}$=35 μm. A suitable grating structure was imprinted with a line spacing of 80 nm on a commercially available silicon nitride membrane and then positioned in a C2-condenser aperture of a microscope.

Figure 9:
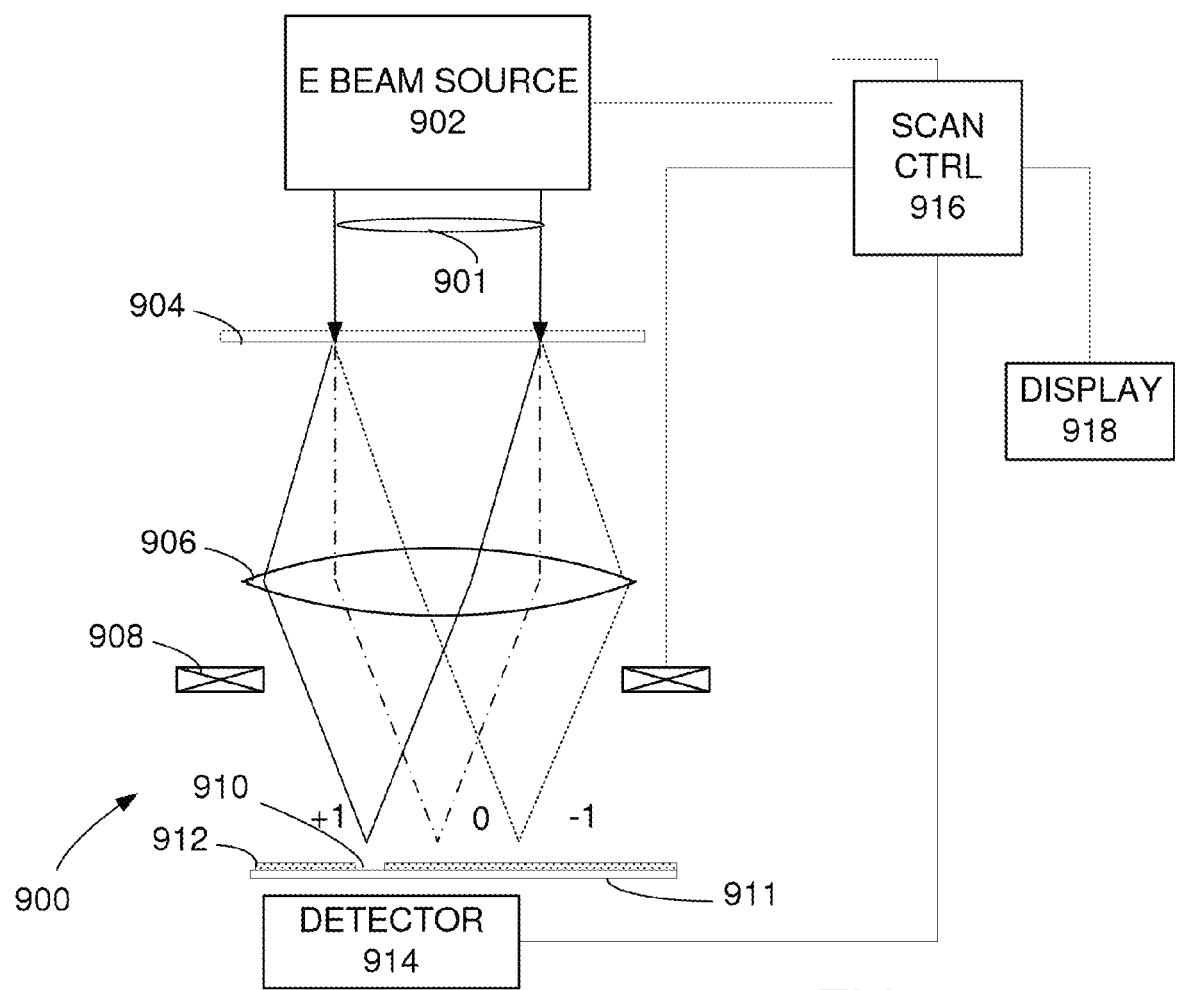
FIG. 9 is a schematic diagram of a scanning transmission electron microscope (STEM) that scans a Gaussian electron beam with respect to a sample under investigation.

In one example, electron beams formed using phase gratings are include in a STEM, and can compensate or correct lens aberrations that tend to increase scanning beam spot size. With reference to FIG. 9, a STEM 900 includes an electron beam source 902 that produces an electron beam 901 that is directed to a phase grating 904. As shown in FIG. 9, the phase grating 904 produces −1, 0, and +1 diffraction orders that are focused at an aperture plate 912. A selected order (+1) is transmitted by an aperture 910 in the aperture plate 912 to a specimen 911. The selected diffraction order has an intensity profile based on the phase variation in the phase plate 904, and is scanned with the aperture 910 with electron scan optics 908. A control system 916 is coupled to the scan optics 908, the electron beam source 902, and an electron detector 914 situated proximate the specimen 911. Based on detected electrons and beam scanning, the control system 916 provides an image signal to a display 918, or produces a digital or other image for storage on one or more computer-readable media such as RAM, ROM, a hard disk, or other device.

Figure 10:
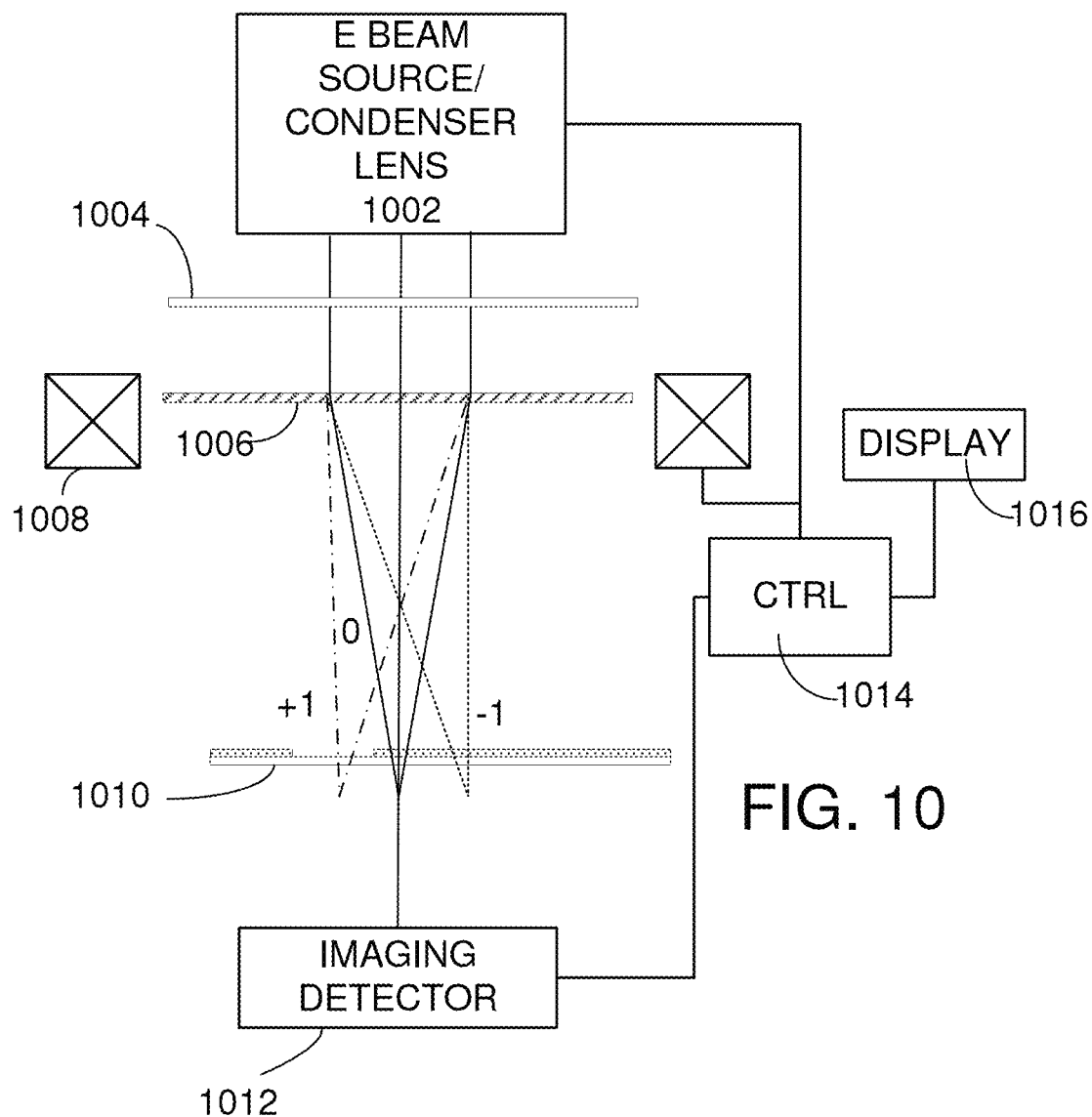
FIG. 10 is a schematic diagram of a transmission electron microscope (TEM) that produces a specimen image using an objective lens with a phase grating aberration correction.

FIG. 10 is a schematic diagram illustrating a representative transmission electron microscope (TEM) that includes a phase grating for aberration correction. An electron source/condenser lens assembly 1002 directs an electron beam to a specimen 1004 and then to an aberration correcting phase grating 1006 and an objective lens 1008. The grating 1006 produces −1, 0, and +1 diffraction orders (and perhaps others), wherein the grating imparts a phase shift to the +1 order so as to compensate phase errors produced by the objective lens 1008 due to spherical aberration or other aberration or imaging deficiency. An aperture 1010 is situated to transmit the +1 order and block or attenuate other diffraction orders. An imaging detector 1012 receives an image of the specimen produced by the objective lens 1008. A control system 1014 processes an image signal from the imaging detector 1012, and is coupled to the objective lens 1008 and the electron beam/condenser lens assembly 1002 as well as a display 1016. For convenient illustrating, imaging paths to the imaging detector are not shown.

Figures 11A, 11B, 11C, 11D, 11E, 11F:
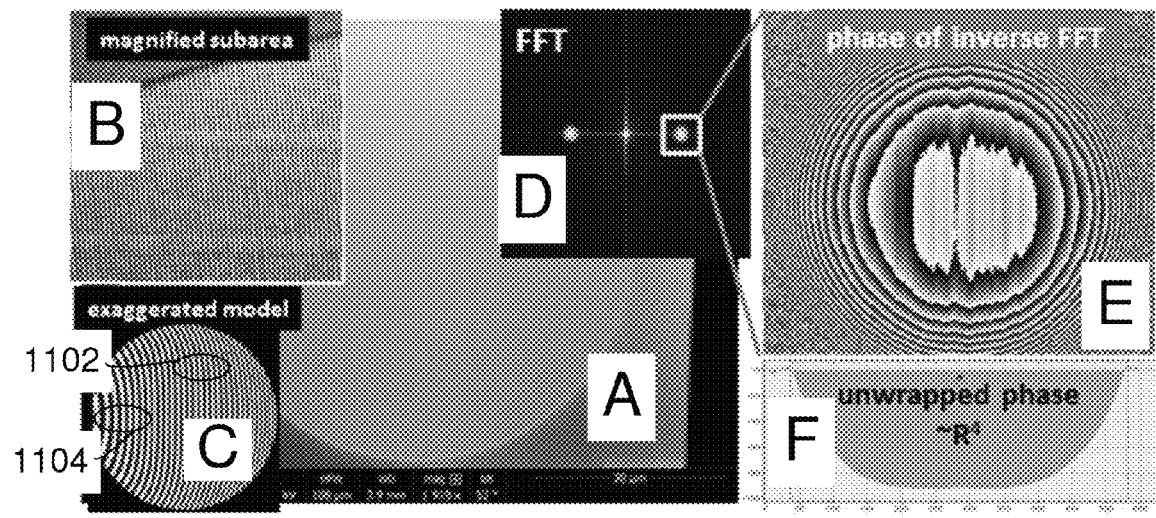
FIGS. 11A-11C are scanning electron microscope (SEM) images of portions of a representative phase grating defined by grating lines in a silicon nitride membrane that produce a radially dependent phase shift that corresponds to an aberration function of an objective lens.
FIG. 11D shows diffraction orders associated with phase grating of FIGS. 11A-11C.
FIGS. 11E-11F shown phase that is imprintable with the grating of FIGS. 11A-11C on the +1 diffraction order.
Figures 12A, 12B, 12C:
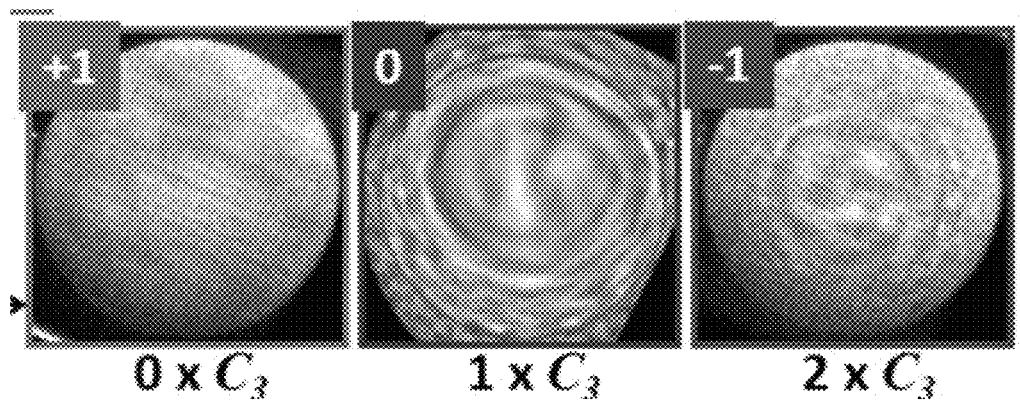
FIGS. 12A-12C are Ronchigrams illustrating correction of spherical aberration in a +1 diffraction order, uncorrected spherical aberration ($C_3$) in a $0^{th}$ diffraction order, and increased (doubled) spherical aberration ($2C_3$) in a −1 diffraction order, respectively.

FIGS. 11A-11C are images of a representative phase grating intended for spherical aberration correction or compensation. In FIGS. 11A-11B, grating lines appear parallel. For purposes of illustration, FIG. 11C show an arrangement of grating lines that shows variable grating phase (i.e., grating pitch or line spacing) that is associated with aberration correction. A grating area 1102 has relatively uniformly spaced grating lines, and is used for beam portions for which little aberration correction is needed. A grating area 1104 shows unevenly spaced lines (i.e., a more variable grating phase) and is associated with beam portions for which more or substantial aberration correction is needed. FIG. 11D illustrates diffraction orders (+1, 0, −1) and FIGS. 11E-11F illustrate phase imprinted on the +1 diffraction order. FIGS. 12A-12C show phase grating effects associated with +1, 0, −1 diffraction orders; only the +1 order is associated with spherical aberration reduction. In other examples, 0, −1, or other orders can correspond to an aberration corrected beam.

Figure 13:
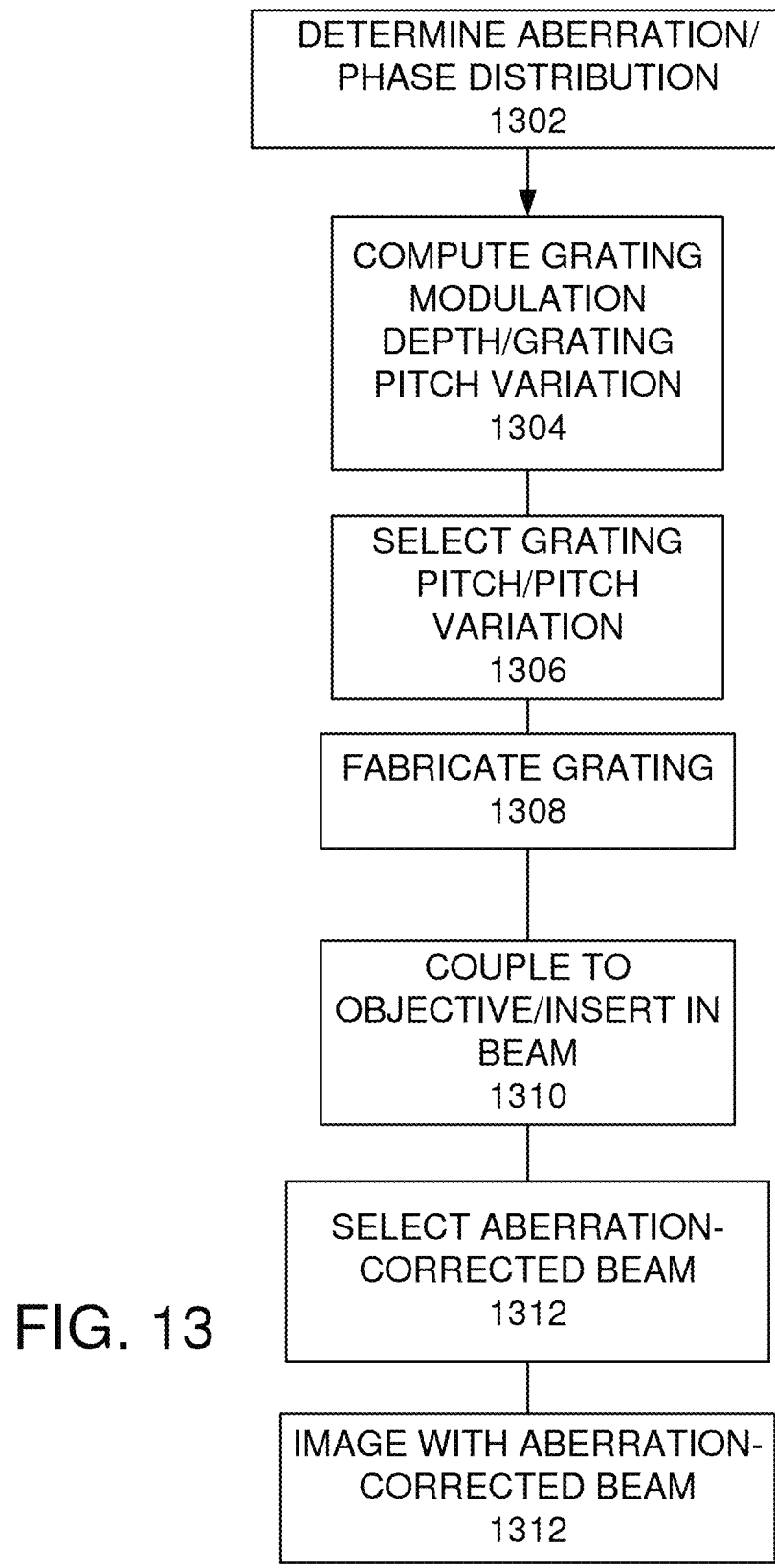
FIG. 13 illustrates a representative method of aberration correction using an electron beam grating.

Referring to FIG. 13, a representative method of aberration correction includes determining a required phase distribution at 1302 and computing corresponding grating phase depths/pitches at 1304. At 1306, a grating pitch is selected, and at 1308 a phase grating is fabricated by focused ion beam milling, direct write electron beam lithography or other processes. At 1310, the phase grating is coupled to the lens to be corrected, and when exposed to an incident beam, a particular diffraction order associated with phase correction is transmitted at 1312 while other orders are blocked or attenuated. At 1314, an image is formed using the aberration-corrected beam. The image can be a TEM image, an STEM image, or image produced in some other fashion.

In the above examples, a +1 diffraction order is used for beam shaping and aberration correction. Other diffraction orders can be used. For example, a −1 order can be used by inverting the applied phase, A +2 order can be used by reducing the applied phase in the +1 order to ½ of a required value, but lower orders are generally more convenient and have higher diffraction efficiencies. An $n^{th}$ diffraction order produces an imprinted phase that is proportional to n times the phase $\phi$ imprinted in first diffraction order, such that the imprinted phase for an arbitrary order is $\phi_n = \pm n\phi$, which includes the sign of the diffraction order. In other examples, a $0^{th}$ order can be have a desired phase or intensity distribution. For example, by preferentially diffraction perimeter portions of a beam of uniform intensity, a Gaussian beam can be produced. A $0^{th}$ order beam can be more convenient as such a beam typically continues to propagate along an original optical axis. In some other examples, diffraction efficiencies can be sufficiently high so that a $0^{th}$ order diffraction intensity is substantially reduced. In other example, a $0^{th}$ (undiffracted) order is used by subtracting intensity and phase through diffraction into higher orders. In some applications, a beam is both aberration corrected and shaped to have a Gaussian or other selected intensity profile.

EXAMPLE 3

Electron Phase Zone Plates

Figure 14:
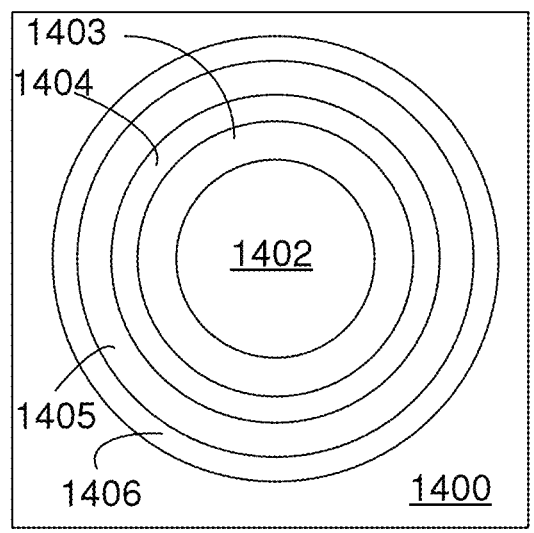
FIG. 14 illustrates a representative phase zone plate for use with electron beams.

Focusing and other processing of electron beams can also be accomplished with amplitude or phase zone plates. Phase zones plates (such as Rayleigh-Wood phase-reversal plates) are generally preferred to amplitude plates (Fresnel zone plates). A representative phase plate is illustrated in FIG. 14. The phase plate 1400 includes a plurality of phase zones 1402-1406, wherein each zone adds or substrates one-half wavelength to the optical path of beam portions in these zones. Zone radii can be determined as:

$$r_n^2 = nf\lambda + \frac{n^2\lambda^2}{4},$$

wherein n is an integer designated a zone number, f is a lens focal length, and $\lambda$ is a beam wavelength. Zones 1402-1406 correspond to n=1, 2, 3, 4, and 5. For typical electron beams associated with accelerating potentials between 10 kV and 200 kV, electron beam wavelength is between about 2 pm and 15 pm, and the second term in the above equation can be neglected. Thus, in most examples, $r_n = \sqrt{nf\lambda}$ so that zone radii vary as the square root of zone number. For a focal length of 0.1 m and an electron wavelength of 10 pm, zone radii $r_n$ in units of μm are equal to $\sqrt{n}$. Phases of the various zones can be established with varying thickness of silicon nitride or other materials produced by ion beam milling or other process.

EXAMPLE 4

Hollow Cone Illumination in TEM

Figure 15:
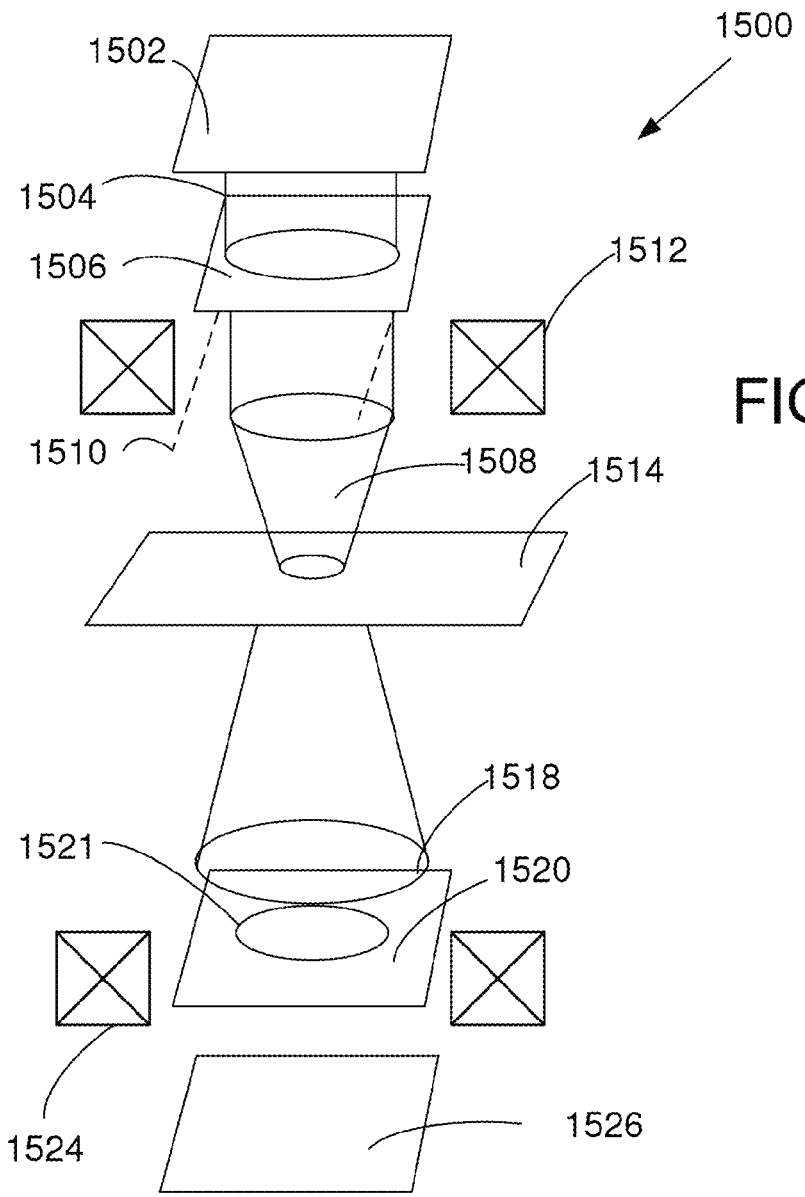
FIG. 15 illustrates a representative electron diffraction system using a fork-patterned grating or other diffractive element having a phase dislocation suitable for producing a hollow conical electron beam.
Figure 16:
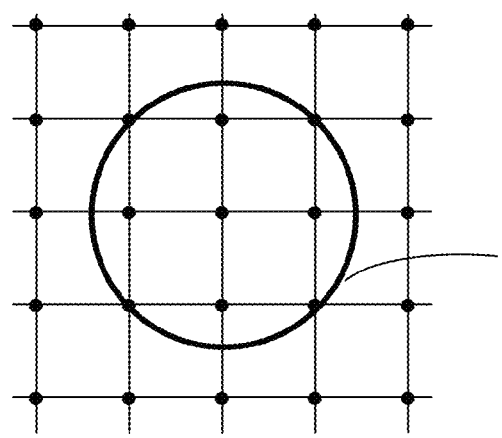
FIG. 16 illustrates a representative ring diffraction pattern obtained using a hollow conical beam.

Referring to FIG. 15, a TEM 1500 includes an electron beam source 1502 that directs an electron beam 1504 to a grating 1506 that produces a hollow beam 1508 in a selected diffraction order, along with one or more other diffraction orders such as the diffraction order 1510 shown with dashed lines. Hollow beams can be produced with gratings that imprint a phase dislocation or so-called forked gratings, such as described in McMorran, U.S. Patent Application Publication 2012/0153144, which is incorporated herein by reference. Unselected diffraction orders are typically blocked by one or more apertures, or are otherwise prevented from reaching a specimen or an electron detection system. The hollow beam 1508 is focused by an electron lens 1512 to a polycrystalline substrate 1514. A diffraction pattern associated with nano-scale specimen crystals is produced that includes a ring 1518 corresponding to an average of parallel beam diffraction patterns. An aperture plate 1520 includes an aperture 1521 that is sized to attenuate electron beam portions associated with the diffraction ring 1518, and the attenuated beam is directed to a magnetic or other lens 1524 that forms an image of the specimen 1514 at a detector 1526. FIG. 16 illustrates a representative diffraction pattern that includes a diffraction ring 1602 of angular diameter $2\alpha$, wherein $\alpha$ is a cone half angle of a hollow beam. The ring corresponds to a time average of spot-like diffraction maxima rotated about an axis of the hollow cone. Typically, only low order diffraction rings (for example, rings for which $h^2+j^2+k^2 \leq 2$, wherein h, k, l are integer indices of a diffraction vector $g_{hkl}$) are included.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

We claim:

1. An apparatus, comprising:
   a diffractive element situated to receive a particle beam and produce at least one diffracted particle beam in a selected diffraction order, wherein the diffractive element defines a phase variation associated with a particle beam intensity profile; and
   an aperture situated to transmit the selected diffraction order.

2. The apparatus of claim 1, wherein the phase variation is associated with a Gaussian intensity profile.

3. The apparatus of claim 1, wherein the diffractive element includes periodic grooves having a groove depth selected to produce a Gaussian phase variation.

4. The apparatus of claim 1, wherein the diffractive element defines a phase variation correspond to at least one Laguerre-Gaussian or Hermite-Gaussian beam intensity profile.

5. The apparatus of claim 1, wherein the diffractive element is defined in a silicon nitride substrate and includes periodic grooves of depth between 1 nm and 200 nm, wherein a groove period is between 10 nm and 200 nm.

6. The apparatus of claim 1, further comprising a particle beam lens, wherein a phase variation of diffractive element grooves corresponds to a phase error associated with the particle beam lens.

7. The apparatus of claim 6, wherein the particle beam lens is situated to receive the particle beam from the diffractive element.

8. The apparatus of claim 7, wherein the particle beam is an electron beam.

\* \* \* \* \*